United States Patent [19]

Chan et al.

[11] Patent Number: 4,829,301

[45] Date of Patent: May 9, 1989

[54] DIGITAL FIRST ORDER HOLD CIRCUIT

[75] Inventors: Fred N. Chan, Atherton; Gerald J. Wensley, Sunnyvale, both of Calif.

[73] Assignee: Ford Aerospace & Communications Corporation, Detroit, Mich.

[21] Appl. No.: 120,556

[22] Filed: Nov. 13, 1987

[51] Int. Cl.[4] .......................... H03L 7/06; H03M 1/00
[52] U.S. Cl. ...................................... 341/122; 331/18; 341/166
[58] Field of Search .......... 341/11, 147, 144, 166–169, 341/122–124; 331/17, 18; 328/14

[56] References Cited

U.S. PATENT DOCUMENTS

| | | | |
|---|---|---|---|
| 4,251,779 | 2/1981 | Kellogg et al. | 331/1 |
| 4,326,173 | 4/1982 | Newman | 331/1 |
| 4,454,486 | 6/1984 | Hassun et al. | 332/16 |
| 4,489,287 | 12/1984 | Naguno et al. | 331/1 |
| 4,626,787 | 12/1986 | Mefford | 328/14 |
| 4,679,004 | 7/1987 | Takahara et al. | 331/18 |

Primary Examiner—Vit W. Miska
Assistant Examiner—Helen Goh
Attorney, Agent, or Firm—Edward J. Radlo; Kenneth R. Allen; Keith L. Zerschling

[57] ABSTRACT

There is provided a digitally controlled first order hold circuit and waveform synthesizer for digitally controlling the representation of a function over an approximation interval. In accordance with the operation of the invention, the first order hold circuit and waveform generator receives a digital data input signal which contains initial condition data, up/down data, and slope data for the approximation interval. The initial condition data is loaded into an up/down counter which is incremented using counting data at a rate depending on the value of the slope data and in a direction depending on the value of the up-down data. In order to minimize delays arising from data acquistion, two frequency synthesizer circuits are provided such that one frequency synthesizer provides counting data while the other frequency synthesizer receives slope data. During alternating intervals, the other frequency synthesizer circuit provides counting data while the other circuit receives slope data. In addition, long length data input signals covering a plurality of approximation intervals are provided to reduce the demands on a main system central processing unit.

11 Claims, 9 Drawing Sheets

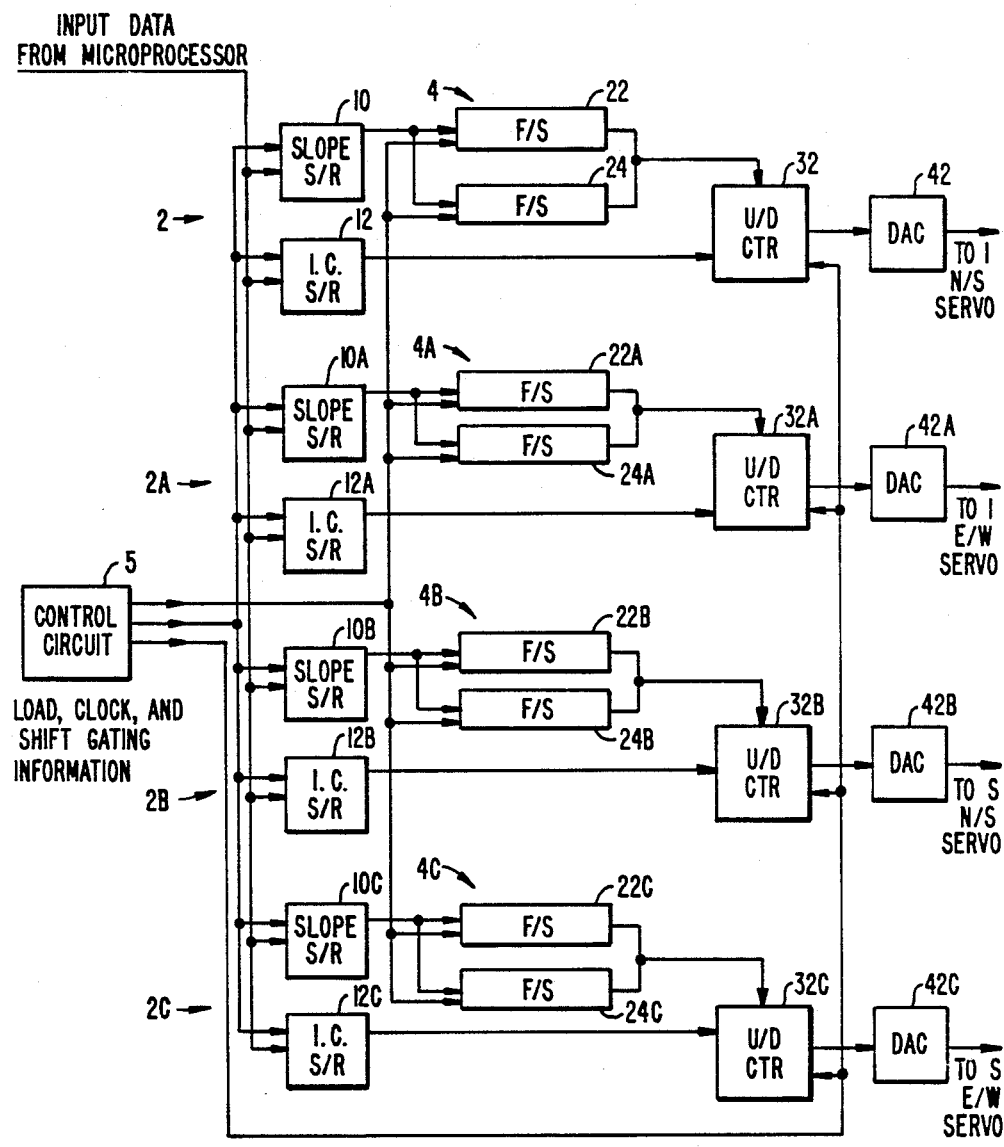
FIG._1.

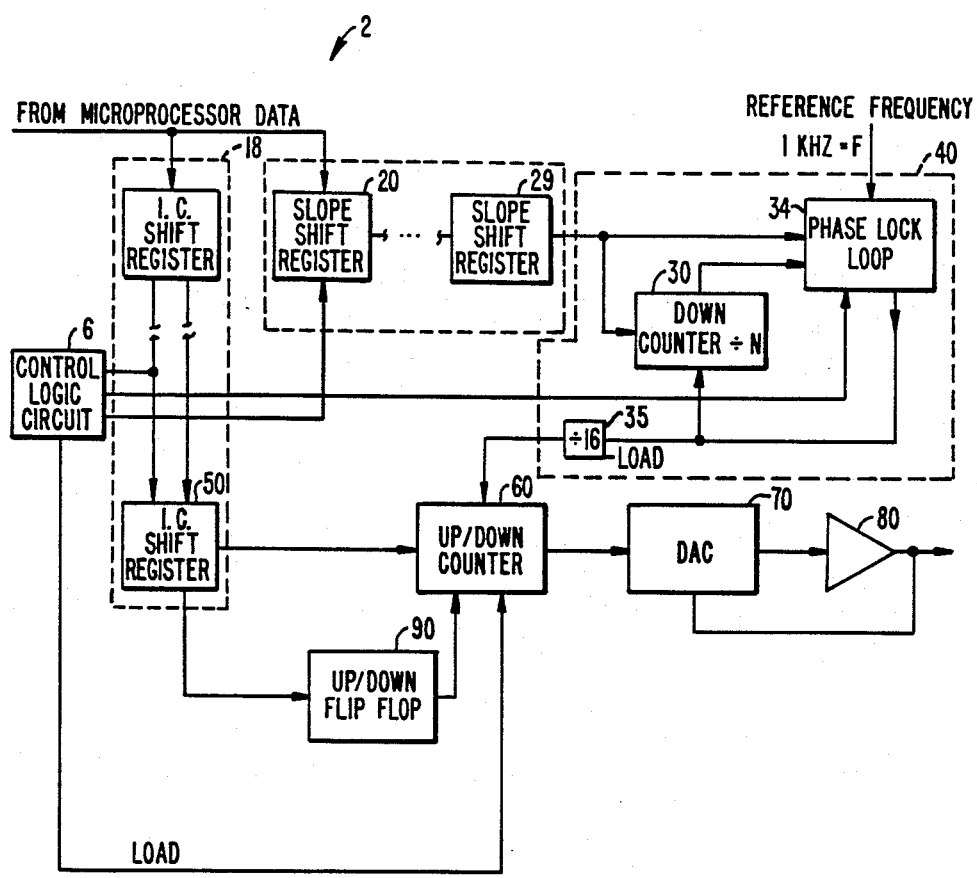
FIG._2.

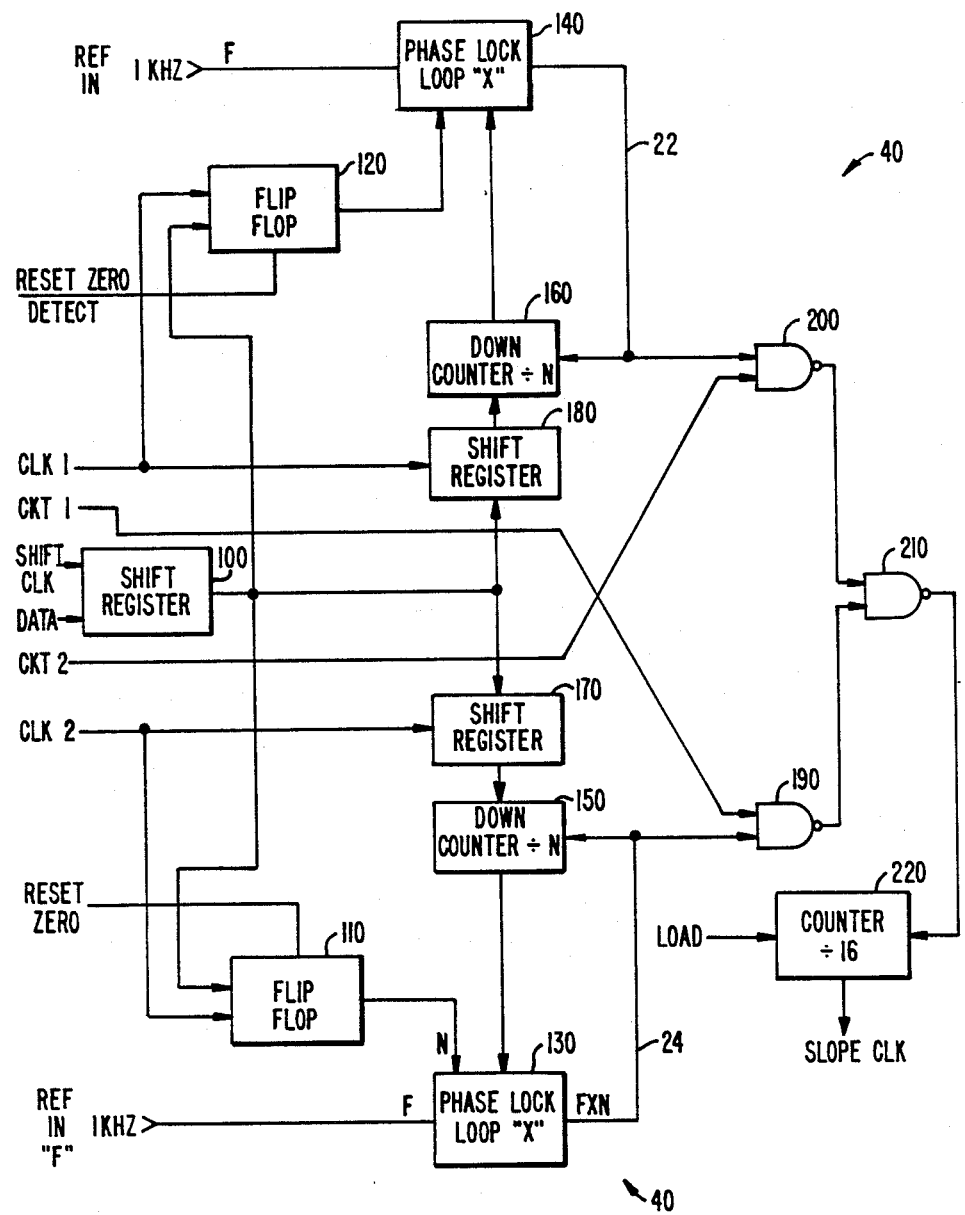
FIG._3.

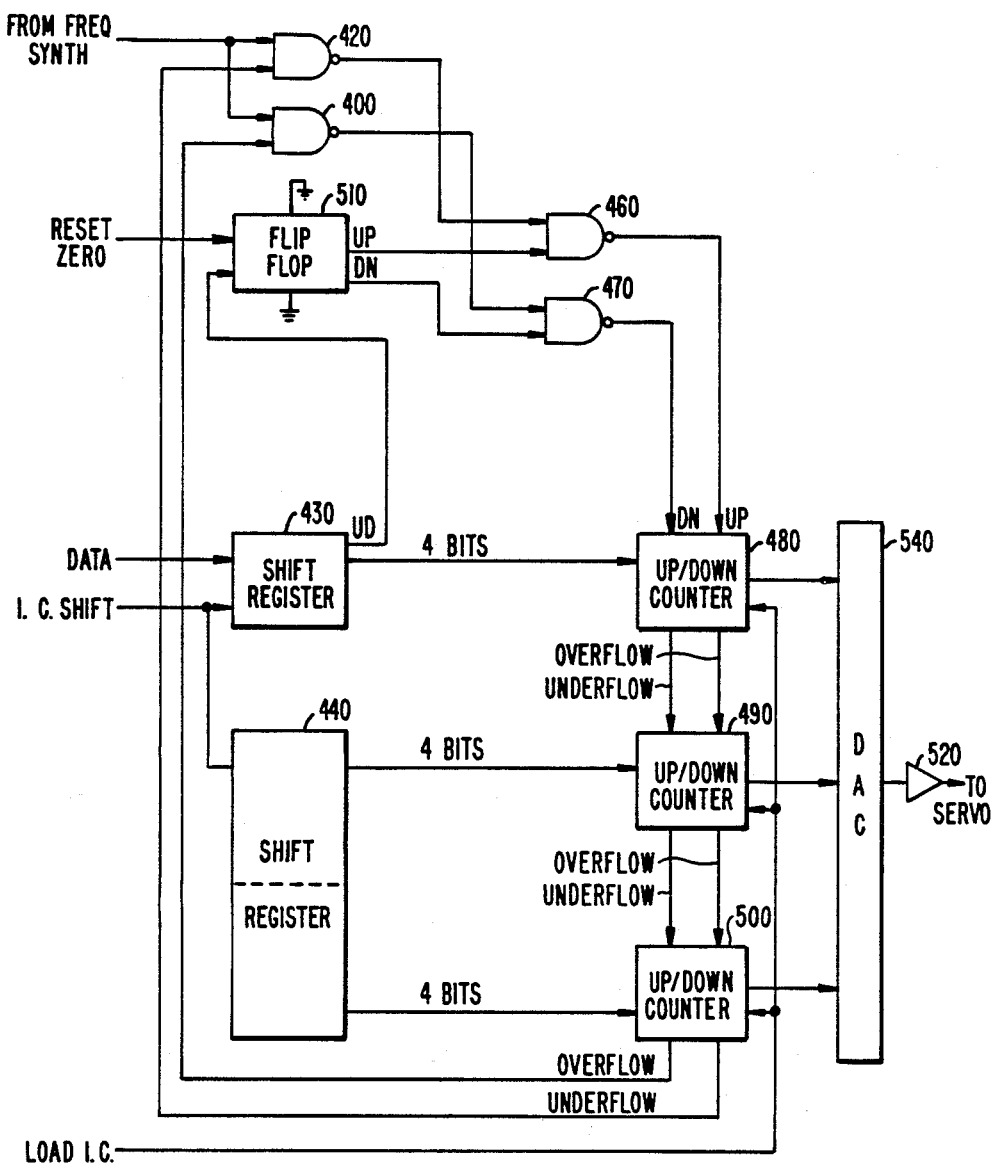
FIG._4.

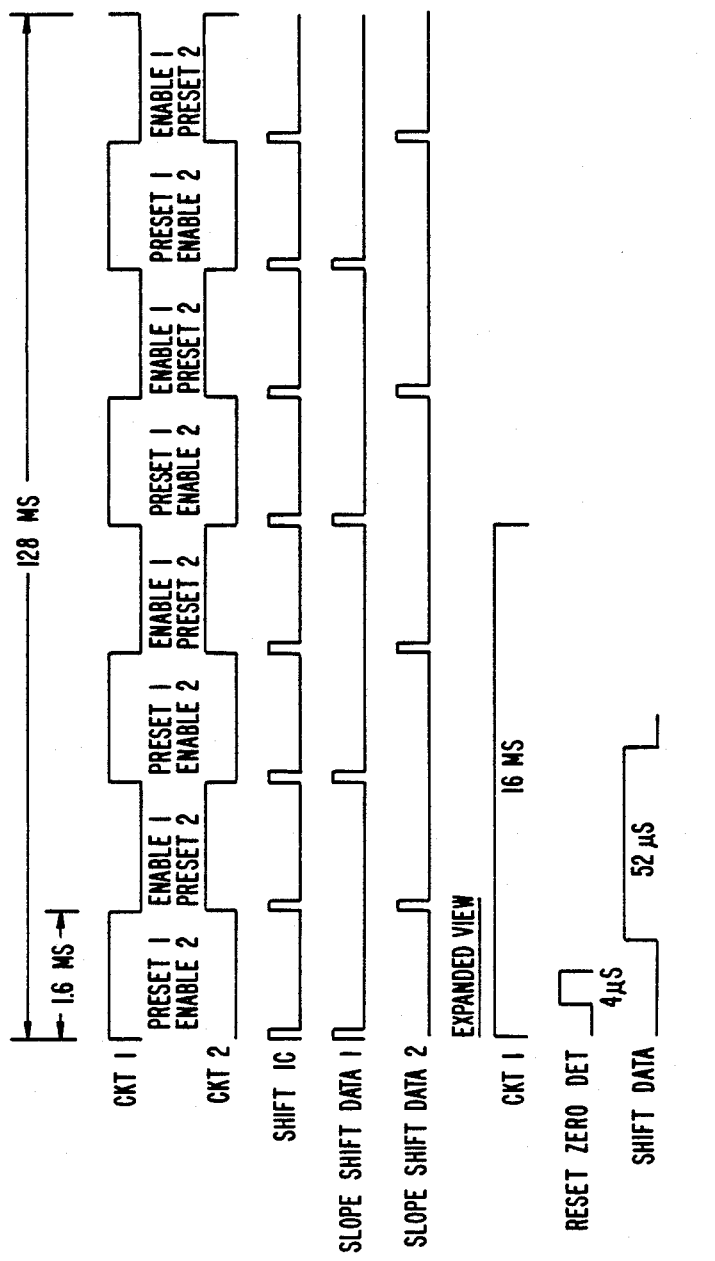
DUAL FREQUENCY SYNTHESIZER GATING
FIG._5.

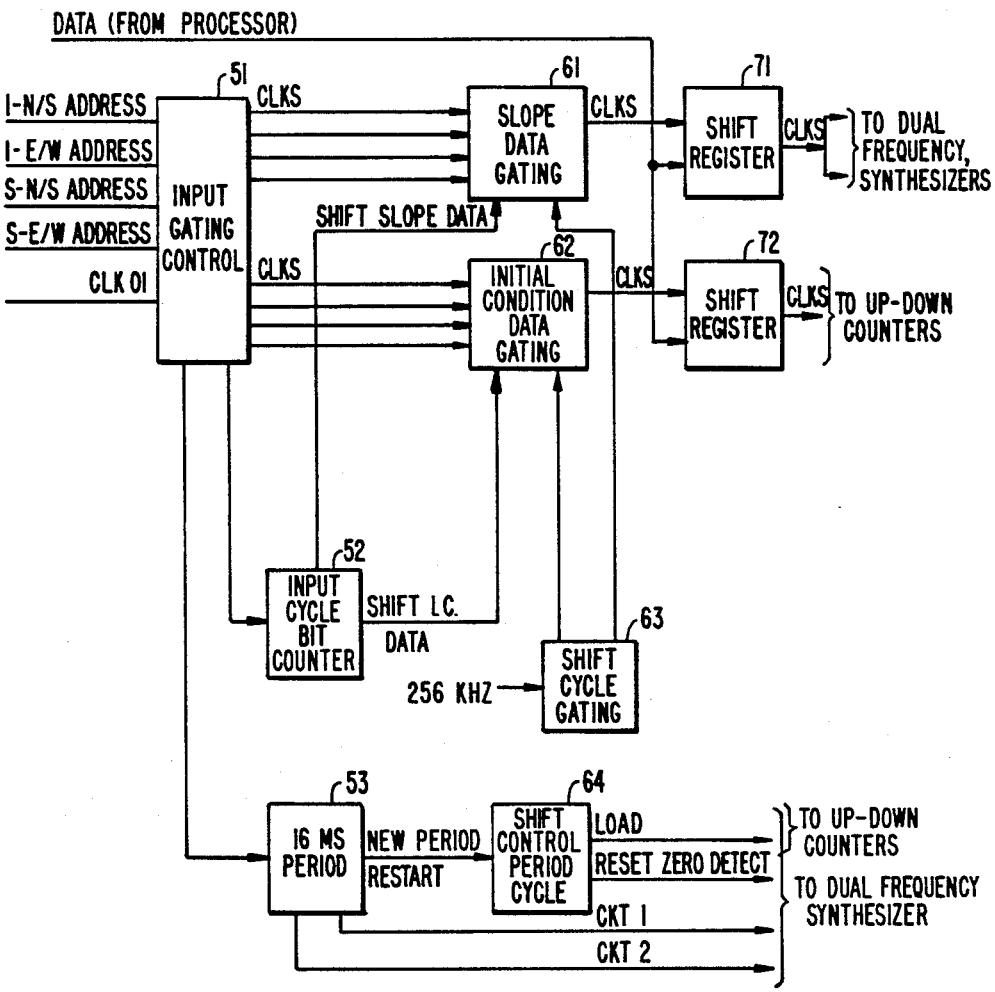
FIG._6.

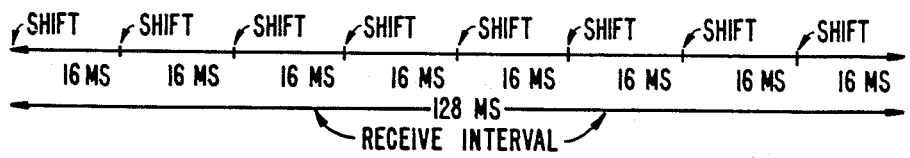
FIG._7.
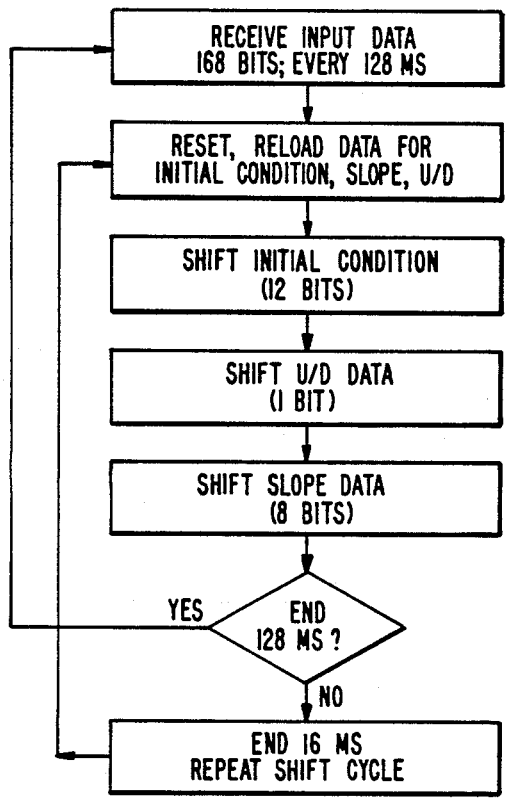
FIG._8.

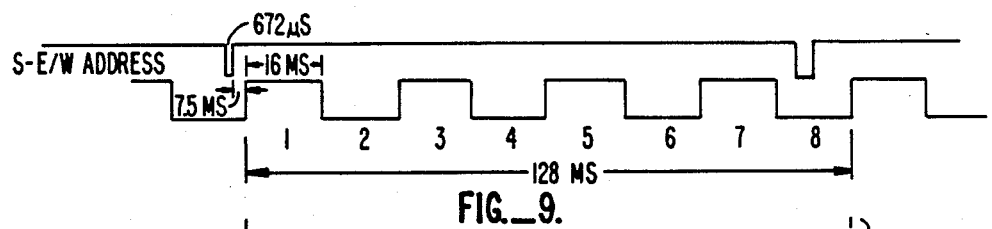
FIG._9.
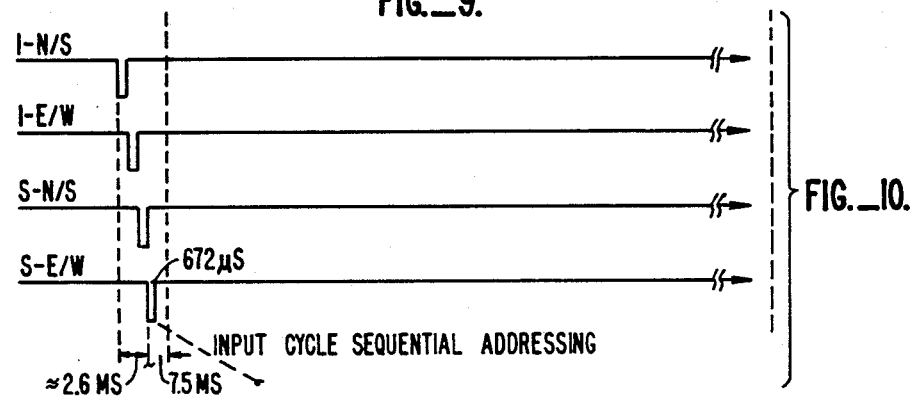
FIG._10.
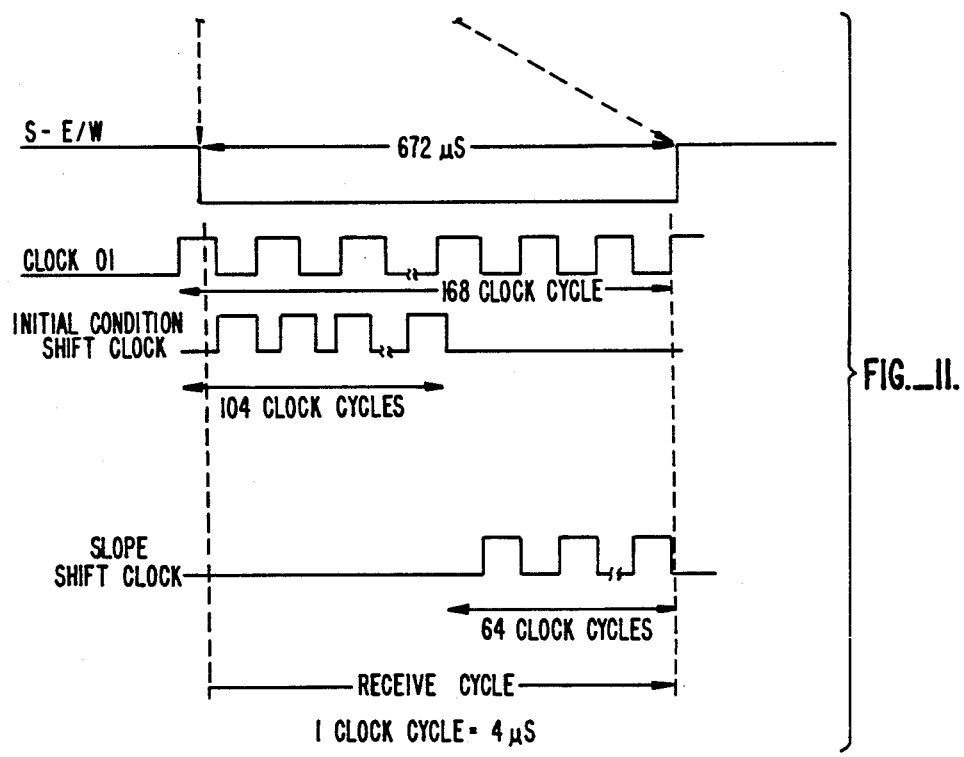
FIG._11.

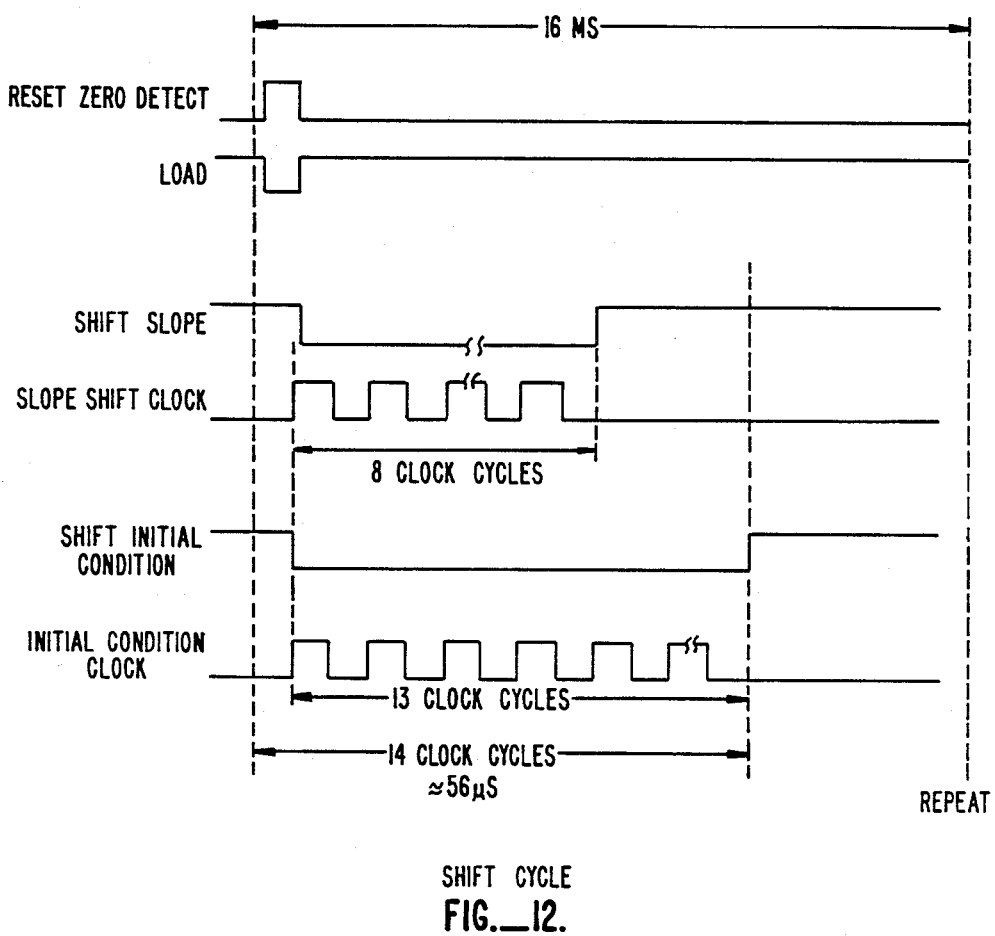
SHIFT CYCLE
FIG._12.

DIGITAL FIRST ORDER HOLD CIRCUIT

The invention described herein was made in the performance of work under NASA Contract No. NASS-29500 and is subject to the provisions of Section 305 of the National Aeronautics and Space Act of 1958, as amended, 42 U.S.C. 2457.

BACKGROUND OF THE INVENTION

The present invention relates to a digital first order hold circuit for digitally controlling the control voltage provided to a servo and like analog devices. The invention also relates to circuits useful for waveform synthesis using digitally controlled approximation techniques and is especially useful in severe environmental applications and where long duty service makes prolonged use of analog control devices infeasible.

Waveform generators of the prior art include those which have used either analog or digital control techniques. Analog waveform generators are known which use a voltage controlled oscillator to generate an analog waveform. However, voltage controlled oscillators, and other analog components, have been susceptible to voltage drift, extreme ambient temperature sensitivity, and errors which increase with duty cycle and aging. As an example of a waveform generator using a voltage controlled oscillator, see U.S. Pat. No. 4,251,779 which describes a frequency synthesizer apparatus and method useful in ultrasonic imaging applications.

Aside from the difficulties relating to analog synthesizers, digitally controlled waveform synthesizers typically have been complex and accordingly expensive. For example, U.S. Pat. No. 4,326,173 discloses a phase locked loop circuit wherein the synthesized frequency bears a non-linear relationship to a reference frequency. As another example, U.S. Pat. No. 4,626,787 discloses a frequency synthesizer having N identical digital module stages wherein each stage generates one digit of the final digital frequency.

As another example, it has been determined that the phase locked loop circuit is generally not useful for controlling frequencies in a widely varying environment because the phase locked loop lacks the required circuit stability to accomplish precise frequency control of its output with the rapidity dictated by the very short use times appropriate in employment in certain systems. Thus, one of the limitations of the phase locked loop circuit is that the phase locked loop circuit, in and of itself, is not capable of very rapidly changing from one selected frequency to another. Known attempts to resolve the problem of rapid flexibility for phase locked loop circuits, such as that described in frequency synthesizer circuit, U.S. Pat. No. 4,251,779 have required extremely complicated digital processing circuitry. However, as digital processing becomes more complicated, problems of dedication of central processing time, data acquisition and delay, and the probability of generation of data error, become significant design considerations.

In addition to the foregoing limitations, prior art digital waveform synthesizers have lacked the ability to self correct for the impact of analog generated errors, such as voltage drift, or for digital generated errors, such as transient data or erroneous data input.

Accordingly, there exists a general need for a digitally controlled waveform synthesizer having reduced dependence on analog techniques such that voltage drift, temperature sensitivity, and performance during extreme environmental applications can be optimized.

There also exists a need for a digitally controlled waveform synthesizer having a simple design which is useful for high speed data processing applications and which keeps the delay time for acquiring and processing data to a minimum.

There also exists a need for a device having self-correction features to minimize the impact of error generation.

There also exists a need for a digital first order hold circuit for providing a frequency responsive representation of a waveform over an approximation interval.

What is further desired is a simple digitally controlled waveform synthesizer and method for permitting rapid response to changing frequency requirements without involving very complex digital processing circuitry.

SUMMARY OF THE INVENTION

According to the invention there is provided a digitally controlled, frequency responsive first order hold circuit and waveform synthesizer for digitally controlling the representation of a function over an approximation interval.

In accordance with the operation of the invention the first order hold circuit and waveform generator receives a digital data input signal which includes initial condition data, up/down data, and slope data, for the approximation interval. The initial condition data is loaded into an up/down counter which is incremented using counting data at a rate determined by the value of the slope data and in a direction determined by the value of the up/down data. In order to minimize data acquisition delays, two frequency synthesizer circuits are provided such that one frequency synthesizer provides counting data while the other frequency synthesizer is receiving slope data. During alternating intervals, the other frequency synthesizer circuit provides counting data while the alternate circuit receives slope data. In addition, long length data input signals covering a plurality of contiguous approximation intervals are provided to reduce the demands on a main system central processing unit.

The frequency synthesizers include phase locked loops, down counters, and associated logic circuits which are digitally controlled by the slope data. The output of each phase locked loop circuit is coupled back to the input of the phase locked loop circuit through a down counter in order to phase and frequency locks with a reference frequency. The circuit is particularly useful in high speed data processing applications and in one embodiment finds application as a control circuit for providing a control voltage through a digital to analog converter to a plurality of servo motors. In this embodiment, the circuit is capable of providing a waveform having a frequency from zero to approximately 16 kHz during 16 ms intervals. The circuit consists primarily of shift registers, two phase locked loop circuits, a local control circuit, and logic circuits.

The invention will be understood in more detail by referring to the following detailed description and claims and to the drawings in which,

BRIEF DESCRIPTION OF THE DRAWINGS

FIG. 1 is a simplified block diagram of the invention showing a slope shift register, an initial condition shift register, dual frequency synthesizers, and an up/down counter.

FIG. 2 is a more detailed blocked diagram illustrating the system shown in FIG. 1.

FIG. 3 is a block diagram depicting the dual frequency synthesizers according to the invention.

FIG. 4 is a block diagram depicting initial condition shift registers and up/down counters according to the invention.

FIG. 5 is a timing diagram showing the dual frequency synthesizer gating.

FIG. 6 is a block diagram of a control circuit used according to the invention.

FIG. 7 is a timing diagram showing a basic 128 ms data receive interval having 816 ms shift intervals therein.

FIG. 8 is a flow diagram showing the various steps according to the invention.

FIG. 9 is a graphic depiction of the input data receive timing in accordance with the invention.

FIG. 10 is a sequential timing diagram showing the data input cycle for four digital control circuits according to the invention.

FIG. 11 is a detailed timing diagram illustrating the data receive cycle according to the invention.

FIG. 12 is a detailed timing diagram illustrating the data shift cycle in accordance with the invention.

DETAILED DESCRIPTION

Referring now to FIG. 1, FIG. 1 shows a block diagram of four digital first order hold circuits according to the invention. The first order hold circuits depicted in FIG. 1 have been included in actual operation in a control system for providing control signals to two imager and two sounder servos. The imager and sounder servos in the preferred embodiment are used in a system for moving scan mirrors on a satellite which observes the earth. In this system, two servos control an imaging mirror and two servos control a sounder mirror. The imaging mirror is controlled by a north-south servo which moves the mirror in the north/south direction and an east-west servo which moves the mirror in an east-west direction. Likewise the sounder mirror is controlled by two servos, one of which moves the servo in a north-south direction, and another which moves the servo in an east-west direction.

In actual usage, these servos correct the scan pattern of the imaging and sounder mirrors to compensate for the fact that the surface of the earth, due to orbit, location, and inclination is curved and discontinuous, and that the mirrors are therefore scanning varying curves instead of a straight line. In actual operation aboard a spacecraft, it is highly undesirable to dedicate the main system microprocessor to controlling the operation of servos. Therefore the microprocessor calculates the proper scan curve for each mirror and sends out discrete data bits to the control circuits at 128 ms intervals. One purpose of the digital first order hold circuit is to provide a circuit which accurately approximates the digitally known proper scan curves during these approximation intervals. Thus, one of the problems solved by the digital first order hold circuits of the invention is the problem of providing a smooth yet rapid and flexible approximation waveform between receipt of discrete input data provided from the microprocessor.

Shown in FIG. 1 are a plurality of hold circuits 2, 2A, 2B and 2C. FIG. 1 depicts four first order hold circuits, one for each of the servos as previously discussed. Each hold circuit in this particular embodiment of the invention can be considered to be identical and unless otherwise stated, the following discussion will apply with equal weight to either of the circuits. In actual operation each first order hold circuit is used to provide a control voltage to a servo (not shown). Hold circuit 2 provides an analog control signal from a digital to analog converer 41 to an imager north-south servo. Hold circuit 2A provides an analog output from digital to analog converter 42 to an imager east-west servo. Hold circuit 2B provides an analog output from digital to analog converter 43 to a sounder north-south servo and hold circuit 2C provides an analog output from digital to analog converter 44 to a sounder east-west servo. Also shown in FIG. 1 is an input data line from a microprocessor (not shown). The data provided from the microprocessor contains information which corrects for the nonlinear scan lines observed as the satellite scans the earth.

Referring still to FIG. 1, FIG. 1 shows a control circuit 5 that supplies gating, load, and clock information to the plurality of first order hold circuits 2, 2A, 2B and 2C. A detailed diagram of one control circuit in accordance with the invention is shown in FIG. 6. Included within first order hold circuits 2, 2A, 2B and 2C are respective slope shift registers 10, 10A, 10B and 10C and respective initial condition shift registers 12, 12A, 12B and 12C. The shift registers receive data from the microprocessor and are coupled to and controlled by control circuit 5. Coupled to the output of the four slope shift registers 10, 10A, 10B and 10C are four corresponding dual frequency synthesizer circuits 4, 4A, 4B and 4C which include two frequency synthesizers each. Hold circuit 2 includes frequency synthesizers 22 and 24 which are coupled to the output of slope shift register 10. Hold circuit 2A includes frequency synthesizers 22A and 24A which are coupled to the output of slope shift register 10A. Hold circuit 2B includes frequency synthesizers 22B and 24B which are coupled to the output of slope shift register 10B. Hold circuit 2C includes frequency synthesizers 22C and 24C which are coupled to the output of slope shift register 10C.

The output of initial condition registers 12, 12A, 12B and 12C are coupled to corresponding up/down counter circuits. In hold circuit 2, initial condition shift register 12 has an output coupled to up/down counter 32. In hold circuit 2A, initial condition shift register 12A has an output coupled to up/down counter 32A. In hold circuit 2B, initial condition shift register 12B has an output coupled to up/down counter 32B. In hold circuit 2C, initial condition shift register 12C has an output coupled to an input of up/down counter 32C. In each hold circuit, the up/down counters also have an input coupled to control circuit 5 and also have an input coupled to a corresponding dual frequency synthesizer circuit. Thus, in hold circuit 2, up/down counter 32 has an input coupled to the outputs of dual frequency synthesizers 22 and 24. Up/down counter 32A in hold circuit 2A has an input coupled to the outputs of dual frequency synthesizer circuits 22A and 24A. In hold circuit 2B, up/down circuit 32B has an input coupled to the outputs of dual frequency synthesizer circuits 22B and 24B. In hold circuit 2C, dual frequency synthesizer circuits 22C and 24C have outputs coupled to an input of up/down counter 32C.

Each of the up/down counters also has an input which receives a load signal from control circuit 5. Thus, control circuit 5 has a load signal output coupled to inputs to up/down counters 32, 32A, 32B and 32C.

Control circuit 5 also has control signal outputs coupled to frequency synthesizer circuits 22 and 24, 22A and 24A, 22B and 24B, and 22C and 24C.

In addition, in hold circuit 2, the output of up/down counter 32 is coupled to D to A converter 42. In hold circuit 2A, the output of up/down counter 32A is coupled to D to A converter 42A. In hold circuit 2B the output of up/down counter 32B is coupled to D to A converter 42B. In hold circuit 2C, the output of up/down counter 32C is coupled to D to A converter 42C.

As previously mentioned, the output of each D to A converter is coupled to a corresponding servo for providing north-south or east-west control to imaging and sounder mirrors.

Refer now to FIG. 2. FIG. 2 is a more detailed blocked diagram of a digital control (hold) circuit in accordance with the invention. Shown in FIG. 2 is a control logic circuit 6 which has coupled to its output shift registers 18, 20, 29, and 50, up/down counter 60, dual frequency synthesizer 40, and up/down flip-flop 90. Shift registers 18 and 20 receive input digital data from the microprocessor (not shown). In particular, shift register 18 receives initial condition data and up/down data, and shift register 20 receives slope data. Shift register 18 may include a plurality of serially connected shift register which terminate in shift register 50. Shift register 20 may include a plurality of serially connected shift registers which terminate in shift register 29. The output of shift register 18 is coupled to shift register 50. Shift register 18 initially receives 104 bits of information which provide the 12 bit initial condition data and the 1 bit up/down data for 8 16 ms intervals. Shift register 20 initially receives 64 bits of information which provide the 8 bit slope data for 8 16 ms intervals shift register 50 receives the initial condition data and up/down data to be next processed. Shift register 29 receives the slop data to be next processed by the dual frequency synthesizers. Shift register 50 has coupled to its output up/down flip-flop 90 which receives the up/down data, and up/down counter 60 which receives the initial condition data.

Slope shift register 29 has coupled to its output dual frequency synthesizer circuit 40, which includes phase lock loop circuit 34, down connector 30, and down counter 35. The output of slope shift register 29 is coupled to an input to phase locked loop 34 and an input to down counter 30. The output of down counter 30 is coupled to one input of phase locked loop 34. Phase locked loop circuit 34 also has a digital reference frequency (F) and signals from control clock 6 coupled to other of its inputs. Phased locked loop circuit 34 compares the feedback F signal from down counter 30 to the leading edge of reference signal F. Phase locked loop 34 in effect performs a multiplication operation whereby reference frequency (F) is effectively multiplied times the slop data, (N), to provide counting data at the rate of F×N each 16 ms interval at the output of the phase locked loop 34. This counting data output, F×N, is coupled through a counter 35 to one input of up/down counter 60. The output F×N is also feedback coupled to phase locked loop 34 through down counter 30. Down counter 30 acts as a divider circuit to produce at its output a signal indicative of F, the reference frequency, as it appeared at the synthesier output.

Referring still to FIG. 2, up/down counter 60 has coupled to its inputs, initial condition data from shift register 50, up/down data from up/down flip-flop 90, and slope data from dual frequency synthesizer 40.

The initial condition data is loaded from shift register 50 into up/down counter 60. The up/down flip-flop 90 causes the up/down counter 60 to be incremented in a direction, up or down, determined by the up/down data. Dual frequency synthesizer 40 provides at its output counting data at a rate that is directly proportional to N, where N represents the slope data. Thus, in up/down counter 60 the initial condition data is incremented up or down N number of times over the 16 ms interval, causing the initial condition to continuously change N times over the 16 ms interval. As the contents of up/down counter 60 change pursuant to receiving counting data, D to A converter 70, which is coupled to the output of up/down counter 60, experiences a corresponding continuous change in its output voltage. Thus D to A converter 70 gradually changes its output over the entire 16 ms interval (16 ms) as counting data is provided to up/down counter 60, rather than changing abruptly at the beginning of each shift interval. D to A converter 70 has coupled to its output an integrator 80 to smooth the control signal provided from the hold circuit to the servos as previously discussed.

Refer now to FIG. 7 which shows a diagram depicting a basic receive interval of 128 ms which is subdivided into a plurality of 8 16 ms intervals. In actual operation the plurality of first order digital hold circuits shown in FIG. 1 and FIG. 2 would operate according to the sequence shown in FIG. 8.

Referring now to FIG. 8, in the first step, a microprocessor outputs data every 128 ms to the data control circuits. The 128 ms corresponds to 8 shift intervals. The input data in the preferred embodiment consists of 168 serial bits of information for processing during 8 16 ms shift intervals. Each 16 ms shift interval uses 12 bits for initial condition data, 1 bit for up/down data, and 8 bits for slope data for a total of 21 bits per 16 ms interval, or 168 bits per 128 ms receive interval.

At the start of each 16 ms interval, the divide by 16 counter of the frequency synthesizer and the up/down counters are reset by a load signal, causing data to be loaded into the up/down flip-flop, the up/down counters, and the divide by 16 counter. Thereafter, initial condition data, up/down data, and slope data are shifted between receiving shift registers causing the last receiving register to contain the data to be next processed. At the end of eight shifting periods, the entire 168 bits of data have been totally processed by the digital hold circuit of the invention. At the end of the 128 ms receive interval, the microprocessor outputs another 168 bit digital data input to the receiving shift registers.

Refer now to FIG. 9. FIG. 9 shows an input data receive cycle (i.e. addressing) for the sounder east-west servo control circuit. The sequential addressing for each servo requires a 672 ms interval as depicted in the top most line in FIG. 9. The sounder east-west servo is the last circuit to be set prior to the initiation of the loading and shifting cycles. Addressing for the sounder east-west control circuit is completed at least 7.5 ms prior to the first shift interval of the succeeding receive cycle.

Refer now to FIG. 10. FIG. 10 shows the input cycle sequential addressing for the imager north-south control circuit, imager east-west control circuit, the sounder north-west control circuit and the sounder east-west control circuit. The circuits are addressed in the following order. The imager north-south circuit is addressed first and addressing for this circuit takes approximately 0.672 ms. The imager east-west circuit is addressed next and sequential addressing from the microprocessor takes approximately 0.672 ms. Similarly, sequential addressing for the sounder north-south circuit and the sounder east-west circuit takes 0.672 ms apiece. Sequential addressing is completed upon sequential addressing of the sounder east-west circuit. The entire sequential addressing cycle takes approximately 2.6 ms.

Refer now to FIG. 11. FIG. 11 is a blown-up view of the 0.672 ms cycle which comprises the input data receive cycle (i.e. sequential addressing) for each control circuit. Shown as an example in FIG. 11 is sequential addressing for the sounder east-west control circuit. A clock 1 signal has four μs clock cycles. Thus, the 0.672 ms cycle would include exactly 168 clock cycles. Also shown in FIG. 11 are initial condition shift clock signals, shift and slope shift clock signals which are coupled from the control circuit to the various shift circuits during the 0.672 ms interval. The initial condition shift clock signal has a 104 clock cycle durations causing the 96 initial condition bits and 8 up/down bits to be received during the receive cycle. The slope shift clock signal consists of a 64 clock cycle signal which causes 64 bits of slope data to be received from the microprocessor. Thus, at the expiration of the 0.672 ms addressing cycle, the shift clock signals have caused receipt and shifting of the initial condition data, the up/down data, and the slope data signals in the serial receiving shift registers.

Refer now to FIG. 12 which depicts the shift cycle, which occurs every 16 ms. During the initial portion of the shift cycle a reset zero detect signal resets the up/down flip-flop load signal causes previously shifted data to be loaded into the up/down counters. During an 8 clock cycle interval, the slope data is shifted forward in receiving slope data shift registers and during a contemporaneous 13 clock cycle interval, the initial condition data is shifted forward in receiving initial condition data registers. The slope data shift occurs due to the slope shift clock signal that is coupled from the control circuit to the slope shift circuit. The initial condition is shifted because the initial condition shift clock signal is coupled from the control circuit to the initial condition shift register. The shift cycle shown at FIG. 12 is repeated at the beginning of each 16 ms interval.

FIG. 6 is a detailed block diagram of one control circuit arrangement for providing the foregoing clock, load, reset, and CKT signals used by the invention.

Refer again to FIG. 2. In summary, FIG. 2 shows a digital control circuit in accordance with one embodiment of the invention. In actual operation, an input data word including initial condition data, up/down data, and slope data would be received from a microprocessor by shift register 18 and shift register 20 during an address cycle. Shift register 18 would serially shift initial condition data and up/down data to shift register 50 and shift register 20 would serially shift the slope data into shift register 29. Thereafter, shift register 50 would load the initial condition for the first 16 ms interval into up/down counter 60 and the up/down data through up/down flip-flop 90 to up/down counter 60. Shift register 29 would transfer data into the dual frequency synthesizer circuit. Up/down flip-flop 90 would cause up/down counter 60 to be set for incrementing in the up or down direction by the counting data provided from dual frequency synthesizer circuit 40. Up/down flip-flop 90 and the other flip-flops used herein are conventional dual D flip-flops.

In operation, the dual frequency synthesizer circuit 40 would provide counting data to up/down counter 60 at a rate determined by the eight bit slope data coupled to dual frequency synthesizer circuit 40. Thus, dual frequency synthesizer circuit 40 would cause up to 255 bits to be provided to up/down counter 60 over a 16 ms interval in the form of a clock signal. In actual operation, one frequency synthesizer in dual frequency synthesizer 40 would cause counting data to be provided for one 16 ms interval, and the other frequency synthesizer circuit would cause counting bits to be provided to up/down counter 60 for a successive 16 ms interval. Thereafter, the operation of the two frequency synthesizers would alternate back and forth. Accordingly, while one frequency synthesizer circuit is being used for data acquisition, the other frequency synthesizer circuit is being used to provide counting bits to the up/down counter 60. In this way, delay of data acquisition is virtually eliminated from the frequency synthesizer circuits.

Refer now to FIG. 3, which is a detailed block diagram of a dual frequency synthesizer 40, including frequency synthesizers 22 and 24 and feedback coupled down counters 150 and 160. For brevity, only one parallel frequency synthesizer circuit will be discussed hereafter, but it should be understood that the two frequency synthesizers circuits are substantially identical unless otherwise stated. As shown in FIG. 3, data is received in the dual frequency synthesizer circuit at shift register 100. Also coupled to shift register 100 is the shift clock signal.

The output of shift register 100 is coupled to the input of shift register 180. Shift register 180 also has a clock 1 signal coupled to another input. The output of shift register 180 is coupled to down counter 160. The clock 1 signal is also coupled to flip-flop 120. Flip-flop 120 also has the output from shift register 100 coupled to an input, and is also reset by a reset zero detect signal coupled to a reset input. The output of flip-flop 120 is used to inactivate phase locked loop 140 when the slope data equals all "0's", indicating that the initial condition is to remain unchanged for a 16 ms interval. The output of flip-flop 120 is coupled to phase locked loop circuit 140, which has the output of down counter 160 coupled to another input. Also coupled to one input of phase locked loop circuit 140 is a reference frequency F, which in the preferred embodiment is 1 kHz or 16 cycles per 16 ms interval. In actual operation phase locked loop circuit 140 acts as a multiplier and provides at its output a signal of F×N frequency, which could be up to 255×16 steps per 16 ms interval, which corresponds to 255 kHz. This F×N signal output from phase locked loop circuit 140 is coupled to an input of nand gate 200 and is also coupled back to an input of down counter 160. Down counter 160 divides the F×N input signal by N. Thus, by the use of this feedback arrangement, phase locked loop circuit 140 attempts to lock its output to the value F×N. Coupled to another input of nand gate 200 is enable/disable signal, CKT 2.

The configuration of the other frequency synthesizer circuit 24 is substantially the same as has been discussed for frequency synthesizer circuit 22. The output of frequency synthesizer circuit 24 is coupled to nand gate 190 which also has coupled to its input an enable/disable signal, CKT 1. Nand gate 190, and the other nand gates used herein are conventional 2 input nand gates. The output of nand gate 200 is coupled to the input of nand gate 210 which also has coupled to another input and output of nand gate 190. The output of nand gate 210 is coupled to a down counter 220, which also has coupled at another input a load signal. The output of down counter 220 feeds the up/down counter circuit shown in FIG. 4. Down counter 220 divides the output of the dual frequency synthesizer circuit, F×N, by 16 to provide counting data during the 16 ms interval at a rate determined by N, the slope data in the term of a clock signal.

Refer now to FIG. 5, which is an illustration of the dual frequency synthesizer gating scheme. As shown in FIG. 5 the dual frequency synthesizer gating scheme conforms to the 128 ms receive intervals. CKT 1 signal operates to preset frequency synthesizer 24 during the first 16 ms interval. CKT 2 signal operates to enable frequency synthesizer 22 during this first 16 ms interval. During the following 16 ms interval, CKT 1 signal operates to enable frequency synthesizer 24 while CKT 2 signal operates to preset frequency synthesizer 22.

Clock shift data signal 1 operates to shift data to frequency synthesizer 22 at the beginning of every preset 16 ms interval. Clock shift data signal 2 operates to shift data to frequency synthesizer 24 at the beginning of every preset 16 ms interval for synthesizer 24. Thus, as shown in FIG. 5, shift data 1 will cause data to be shifted to frequency synthesizer circuit 22 during first, third, fifth, etc., 16 ms intervals. Shift data signal 2 will cause data to be shifted to frequency synthesizer circuit 24 during the second, fourth, sixth, etc., 16 ms intervals. CKT 1 causes data to be provided from synthesizer 24 during an enable interval for synthesizer 24. CKT 2 causes data to be provided from synthesizer 22 during an enable interval for synthesizer 22. The load signal to counter 35, the up/down counter 60, and up/down flip-flop 90 in FIG. 2 synchronizes the processing of the counting data, up/down data, and the initial condition data at up/down counter 60. In total, as shown in FIG. 5 the shift data signal lasts for approximately 52 μs. A reset/zero detect signal is coupled to flip-flops 110 and 120 in FIG. 3 to provide a reset for D flip-flops 110 and 120.

FIG. 6 shows a control circuit arrangement which provides the foregoing clock shift signals, CKT signals, and load signals.

Refer now to FIG. 4 which depicts the shift registers and up/down counters useful for processing the up/down data, the initial condition data, and the slope data so as to provide a digitally controlled input to the digital to analog converters.

Shown in FIG. 4 is shift register 430 which receives the initial condition data and the up/down data during the beginning of the initial condition shift cycle. Shift register 440 also receives initial condition data during the initial condition shift cycle. Register 430 receives four initial condition bits and 1 up/down bit and register 440 receives 8 initial condition bits. The initial condition bits in shift register 430 are coupled to up/down counter 480 and the up/down bit to flip-flop 510. Four initial condition bits from shift register 440 are coupled to up/down counter 490 and four bits of shift register 440 are coupled to up/down counter 500.

An underflow output of up/down counter 500 is coupled back to an underflow nand gate 400. The output of the dual frequency synthesizer is also coupled to another input to underflow Nand gate 400 and to an input to overflow nand gate 420. Underflow nand gate 400 has an output coupled to an input of nand gate 470. An overflow from up/down counter 500 is coupled to an input to overflow nand gate 420. The output of overflow nand gate 420 is coupled to another input of nand gate 460. The underflow and overflow outputs from up/down counter 500 are normally "1".

A reset/zero signal is coupled to the clock input of flip-flop 510 and the up/down bit is coupled to the data input to flip-flop 510. Flip-flop 510 is grounded at the preset and clear inputs. Flip-flop 510 has an "up" output coupled to a nand gate 460 and a "down" output coupled to nand gate 470. The output of nand gate 460 is coupled to an "up" input to up/down counter 480. The output of nand gate 470 is coupled to a "down" input to up/down counter 480.

An underflow output from up/down counter 480 is coupled to an underflow input to up/down counter 490 and an overflow output from up/down counter 480 is coupled to an overflow input to up/down counter 490. Similarly, an underflow output from up/down counter 490 is coupled to an underflow input of up/down counter 500 and an overflow output from up/down counter 490 is coupled to an underflow input to up/down counter 500. The output from up/down counters 480, 490 and 500 are coupled in parallel to D to A converter 540. D to A converter 540 continuously receives the output from up/down counters 480, 490 and 500 during each 16 ms interval. Any changes to digital values in up/down counters 480, 490 and 500 are immediately sensed by D to A converter 540 and are reflected in the analog output of D to A converter 540. The output of D to A converter 540 is coupled to integrator 520. The output of integrator 520 is coupled to servos which control the scanning mirrors as previously discussed.

A load signal is coupled to inputs to up/down counters 480, 490 and 500.

In actual operation the up/down counters and shift registers depicted in FIG. 4 operate as follows.

Initially, initial condition data comprising thirteen bits (including up/down data) is shifted into shift registers 430 and 440. Shift register 430 obtains 4 bits of initial condition data and 1 up/down data bit, and shift register 440 obtains 8 bits of initial condition data. Shift register 430 is in actuality an 8 bit shift register but only processes 5 bits in the preferred embodiment.

In response to the load signal, the up/down bit is loaded into flip-flop 510 and the twelve initial condition bits are loaded into up/down counters 480, 490 and 500 respectively. Each up/down counter receives 4 digital bits. Meanwhile, the frequency synthesizer circuits have coupled counting data from the down counter divider through the underflow and overflow nand gates and to nand gates 460 and 470.

A "1" up/down bit signifies incrementing in the down direction while a "0" up/down bit signifies incrementing in the up direction. Thus, if the up/down bit is a "0", flip-flop 510 provides a 1 signal from its "up" output which is coupled to nand gate 460. Since nand gate 460 is also provided counting data input from the frequency synthesizers, nand gate 460 will toggle on and off to provide counting data input. Simultaneously, the "down" output of 510 is "0" and is coupled to the input of nand gate 470. Since the input of nand gate 470 from flip-flop 510 is "0", the output of nand gate 470 remains one notwithstanding the counting data input. Thus, the only counting data input to up/down counter 480 is the counting data output from nand gate 460 which is coupled to the "up" input to up/down counter 480. Thus, it can be seen that nand gates 460 and 470 will not simultaneously increment up/down counter 480, but that either one or the other nand gate will provide counting data to up/down counter 480 depending on the up/down output from shift register 430.

Up/down counters 480, 490 and 500 have previously received up to twelve bits of initial condition data. The counting data provided from the frequency synthesizer circuits will be as many as 255 bits provided over a 16 ms interval corresponding to a frequency response of approximately 16 kHz. Thus, up/down counters 480, 490 and 500 can be incremented a maximum of 255 times during any one 16 ms interval, in a direction (up or down) determined by the up/down data bit.

The operation of the up/down counters during an overflow and underflow situation have been provided for by the invention to further minimize the occurrence of errors. Assume that up/down counter 480, 490 and 500 include initial condition data such that only 200 new bits can be added thereto without all the bits in up/down counters 480, 490 and 500 turning to one. Assume further that the slope data requires that 255 counting bits be added to up/down counters 480, 490 and 500 over the current 16 ms interval. Under these circumstances, the 201st counter bit will cause up/down counter 480 to overflow which would cause up/down counter 490 to overflow, which would cause up/down counter 500 to overflow. The resulting overflow bit from up/down counter 500, coupled to the overflow input of overflow nand gate 420 would thereby change from "1" to "0". The output of the overflow nand gate 420 would then lock into the "1" state since the overflow input would remain at "0". Both inputs to nand gate 460, now being "1", nand gate 460 would go to zero at its output, and accordingly, no other bits would be added to up/down counter 480. Accordingly no further bits would be coupled to up/down counter 480, 490 and 500 for the duration of the current 16 ms interval.

Similar action would occur in the event that up/down counters 480, 490 and 500 were incremented down to all zeros and additional counting bits were being provided during the 16 ms to cause the up/down counters to try to increment down below all zeros. In the latter case a "0" underflow signal would be coupled to underflow nand gate 400 which would provide at its output a constant "1" signal to nand gate 480. Since the down input to nand gate 470 would be "1" in an increment down mode and the counting input would remain at "1" because of underflow, the down input to up/down counter 480 would be "0" for the remainder of the 16 ms interval.

Additional error reduction features of the invention can be appreciated by reference to an additional illustration of the operation of up/down counters 480, 490 and 500. Assume that a "zero" initial condition value is loaded by shift registers 430 and 440 into up/down counters 480, 490 and 500. Assume also that counting data from dual frequency synthesizers caused a value of "5" to be incremented into up/down counters 480, 490 and 500 over the 16 ms interval. Thus, the initial condition appearing in up/down counters 480, 490 and 500 at the end of the current 16 ms interval would be a 0101 in counter 480. The 5 counting data provided to up/down counter 480 would be provided to up/down counter 480 at equal intervals during the 16 ms interval.

The central microprocessor which provides the initial input data is configured to have calculated that the resulting value should have been 5. Thus, the next initial condition data provided to the up/down counters 480, 490 and 500 at the end of the current 16 ms interval would include digits representative of the value, "5" i.e., 0101 for counter 480 and all 0's for counters 490 and 500. In the event that the frequency synthesizer circuits had not operated one hundred percent accurately, there would be a differential between the "true" 5 value and the actual value residing in counters 480, 490 and 500. However, the scope of the variation is reduced by incrementing over the shift interval as compared to incrementing the initial condition only once at the beginning of each shift interval. Accordingly, when the new initial condition, 0101, is loaded into up/down counter 480, D to A converter 540 will see a minimal voltage discontinuity.

It can also be seen that the invention is capable of switching very rapidly from low to high frequency responses. For example, in the preferred embodiment the frequency synthesizers may provide up to 255 counter bits per 16 ms intervals, which corresponds to a frequency response of 16 kHz.

It can also be seen that by varying the slope data included in the input digital data, the invention is operative to reconstruct and approximate curved functions as opposed to simply linear functions. That is to say, by changing the slope data over successive 16 ms intervals, the output seen by the digital to analog converter represents a curved function with a minimum of discontinuity.

It can also be seen that by feeding back the output of the phase locked loop circuit through the down counters to the input phase locked loop circuits, and by using reverified initial conditions, the occurrence and impact of analog and digitally generated errors is reduced. It is also clear that the data receive intervals, data shift intervals, and data bit lengths can be chosen according to design considerations to provided desired frequency responsive waveform generation. In the preferred embodiments, the interval lengths and bits were chosen to provide a compromise between dedication of the main CPU, accuracy, and the waveform requirements for the particular servo control application discussed.

While the system has been described in order to illustrate the preferred embodiments, variations and modifications to the herein described system within the scope of the invention, would undoubtedly suggest themselves to those skilled in the art.

Accordingly, the foregoing description should be taken merely as illustrative and the invention should be limited only in accordance with the accompanying claims.

We claim:

1. A method for performing digitally controlled first order approximation of an analog signal during an interval, said analog signal having an initial condition at the beginning of said interval and an end condition at the end of said interval, said method comprising the steps of:

receiving input digital data representative of said analog signal at the beginning of said interval, said input digital data comprising initial condition data, slope data and up/down data; and incrementing said initial condition data during said interval at a rate determined by said slope data and in a direction determined by said up/down data to generate an approximation of said end condition.

2. A method for digitally synthesizing a waveform comprising the steps of:

receiving input digital data representative of said waveform at the beginning of an interval, said input digital data comprising initial condition data, slope data, and up/down data;

processing said slope data to generate counting data during said interval at a rate determined by said slope data; and incrementing said initial condition data with said counting data at a rate determined by said slope data and in a direction determined by up/down data, to synthesize a digital waveform during said interval.

3. The method according to claim 2 wherein said input digital data is representative of a plurality of contiguous intervals.

4. A method for digitally synthesizing a waveform comprising the steps of:

receiving digital frequency control data in a first frequency control circuit during first intervals and in a second frequency control circuit during alternating second intervals;

processing said frequency control data in said first circuit during said second intervals to generate counting data at first rates determined by said frequency control data for said first intervals;

processing said frequency control data in said second circuit during said first intervals to generate counting data at second rates determined by said frequency control data for said second intervals; and incrementing initial condition data with said counting data at said first rates during said second intervals and incrementing said initial condition data with said counting data at said second rates during said first intervals to digitally synthesize said waveform.

5. A control circuit for digitally synthesizing a waveform comprising:

first means for receiving input digital data, said input digital data comprising initial condition data, slope data, and up/down data;

second means coupled to said first means for processing said slope data to generate counting data at a rate determined by said slope data;

third means coupled to said first and second means for incrementing said initial condition data with said counting data at a rate determined by said slope data and in a direction determined by said up/down data; and means coupled to said first, second and third means for providing control signals to synchronize receiving, processing, and incrementing of said data.

6. The digital control circuit according to claim 5 wherein said second means comprise first and second digitally controlled phase locked loop circuits for receiving slope data during alternating first and second intervals respectively; and said first circuit generating said counting data during said second intervals at a rate determined by slope data received during said first intervals and said second circuit generating said counting data during said first intervals at a rate determined by slope data received during said second intervals.

7. The digital control circuit according to claim 5 wherein said third means comprises a plurality of up/down counters.

8. The digital control circuit according to claim 5 wherein said first means comprises a plurality of shift registers.

9. The digital control circuit of claim 6 wherein each phase locked loop circuit has coupled to its input said slope data, a reference frequency signal, and feedback data representative of the value of said reference frequency at the output of said phase locked loop circuit.

10. A circuit for providing digitally controlled first order approximation of an analog signal during an interval, said analog signal having an initial condition at the beginning of said interval and an end condition at the end of said interval, said circuit comprising:

means for receiving input digital data at the beginning of said interval, said input data comprising initial condition data, slope data, and up/down data; and means coupled to said receiving means for incrementing said initial condition data during said interval at a rate determined by said slope data and in a direction determined by said up/down data to generate said end condition.

11. The control circuit according to claim 10 further comprising means for temporarily stopping incrementing said initial condition data down when a predetermined first value is reached and means for temporarily stopping incrementing said initial condition data up when a predetermined second value is reached.

* * * * *